(12) United States Patent
Fox et al.

(10) Patent No.: US 9,903,885 B1
(45) Date of Patent: Feb. 27, 2018

(54) UNIVERSAL DIRECT DOCKING AT PROBE TEST

(71) Applicant: Maxim Integrated Products, Inc., San Jose, CA (US)

(72) Inventors: Morris R. Fox, Los Altos, CA (US); Paras P. Shah, San Jose, CA (US); Eric G. Anusevicius, Brunswick, GA (US); Ricardo C. Pakingan, Cavite (PH); Reinhardt B. Gatchalian, Manila (PH)

(73) Assignee: Maxim Integrated Products, Inc., San Jose, CA (US)

( * ) Notice: Subject to any disclaimer, the term of this patent is extended or adjusted under 35 U.S.C. 154(b) by 74 days.

(21) Appl. No.: 14/852,780

(22) Filed: Sep. 14, 2015

Related U.S. Application Data

(62) Division of application No. 13/079,217, filed on Apr. 4, 2011, now Pat. No. 9,134,357.

(60) Provisional application No. 61/467,634, filed on Mar. 25, 2011.

(51) Int. Cl.
| | |
|---|---|
| *G01R 31/00* | (2006.01) |
| *G01R 1/04* | (2006.01) |
| *G01R 31/28* | (2006.01) |
| *G01R 31/26* | (2014.01) |

(52) U.S. Cl.
CPC ....... *G01R 1/0433* (2013.01); *G01R 31/2601* (2013.01); *G01R 31/2834* (2013.01)

(58) Field of Classification Search
USPC ............. 324/756.02, 755.01–755.11, 756.03, 324/756.05, 754.07, 754.03, 754.11, 324/754.18, 750.25, 750.28, 324/756.01–756.07
See application file for complete search history.

(56) References Cited

U.S. PATENT DOCUMENTS

| | | | |
|---|---|---|---|
| 6,111,419 A | * | 8/2000 | Lefever .............. G01R 31/2851 324/750.16 |
| 6,617,867 B2 | | 9/2003 | Bruno et al. |
| 6,876,215 B1 | | 4/2005 | Hannan et al. |

(Continued)

OTHER PUBLICATIONS

High-performance, multi-site functional testing now possible at wafer probe; http://www1.verigy.com/ate/products/v93000/direct-probe/index.htm; Jul. 18, 2011.

(Continued)

*Primary Examiner* — Patrick Assouad
*Assistant Examiner* — Demetrius Pretlow
(74) *Attorney, Agent, or Firm* — Advent, LLP

(57) ABSTRACT

Techniques are described to provide a universal direct docking tester to prober interface between the test head and a prober of semiconductor wafer prober for testing die within semiconductor wafers. In an implementation, a universal direct docking tester to prober interface includes a tray assembly configured to be mounted within an opening of the prober housing and a stiffener assembly configured to be mounted to a test head to support a load board PCB that includes a probe head. The stiffener assembly includes a skirt that is received in the tray assembly when the test head is interfaced with the prober to position the load board PCB within the prober to facilitate engagement of the probe head with the wafer.

10 Claims, 6 Drawing Sheets

(56) References Cited

U.S. PATENT DOCUMENTS

| | | | |
|---|---|---|---|
| 7,109,733 B2 | 9/2006 | Gudin et al. | |
| 7,733,081 B2 | 6/2010 | Vayner et al. | |
| 2002/0063566 A1 | 5/2002 | Bruno et al. | |
| 2005/0231228 A1* | 10/2005 | Mattes | G01R 31/31932 324/750.02 |
| 2007/0126435 A1* | 6/2007 | Eldridge | G01R 31/2891 324/750.22 |
| 2007/0126440 A1* | 6/2007 | Hobbs | G01R 31/2893 324/754.03 |
| 2007/0128075 A1* | 6/2007 | Bohm | G01R 31/2889 422/68.1 |
| 2007/0128076 A1* | 6/2007 | Bohm | G01R 31/2889 422/68.1 |
| 2008/0036480 A1* | 2/2008 | Hobbs | G01R 31/2891 324/756.03 |
| 2008/0100312 A1* | 5/2008 | Breinlinger | G01R 31/2891 324/756.03 |
| 2008/0186040 A1* | 8/2008 | Hobbs | G01R 31/2863 324/750.28 |
| 2008/0297184 A1 | 12/2008 | Miura et al. | |
| 2009/0146675 A1 | 6/2009 | Karklin et al. | |
| 2009/0237100 A1* | 9/2009 | Namiki | G01R 31/2887 324/756.03 |
| 2010/0102837 A1 | 4/2010 | Abe et al. | |
| 2010/0127726 A1 | 5/2010 | Abe et al. | |
| 2010/0194420 A1 | 8/2010 | Kitazume et al. | |
| 2011/0248735 A1* | 10/2011 | Losey | G01R 31/2889 324/754.11 |
| 2012/0038383 A1* | 2/2012 | Wu | G01R 31/2887 324/756.01 |
| 2012/0081137 A1* | 4/2012 | Pagani | G06F 11/26 324/750.01 |
| 2012/0212248 A9 | 8/2012 | Chong et al. | |

OTHER PUBLICATIONS

Direct Dock Wafer Probing Interfaces; http://www.intest.com/products/intddock.htm; Jul. 18, 2011.

UltraProbe; Interface Ramp Solutions; Teradyne, Inc.; 2010.

Roger Sinsheimer; A Better Tester-Prober Interface Paradigm: Direct Docking; Xandex, Inc.; 2001 Fusion User's Conference.

* cited by examiner

UNIVERSAL DIRECT DOCKING AT PROBE TEST

CROSS-REFERENCE TO RELATED APPLICATIONS

The present application claims the benefit under 35 U.S.C. § 119(e) of U.S. Provisional Application Ser. No. 61/467,634, filed Mar. 25, 2011, and titled UNIVERSAL DIRECT DOCKING AT PROBE TEST, which is herein incorporated by reference in its entirety.

BACKGROUND

Semiconductor wafer probers are a type of automatic test equipment (ATE) employed to test individual die within a semiconductor wafer after fabrication (e.g., prior to packaging of the die). Wafer testing typically employs a prober that includes a wafer chuck configured to hold the semiconductor wafer and a tester head that supports a load board printed circuit board (PCB), which provides an interface between the semiconductor wafer and the test system. The load board PCB is interconnected with a probe card PCB having a probe head that includes a set of probe pins (e.g., microscopic contacts) that engage pads (and/or solder bumps) disposed on the individual dice within the wafer. A spring pin tower provides connectivity between the load board PCB and the probe card PCB, which is mounted to the prober, when the test head is interfaced with the prober. During testing, the probe card PCB and probe head are held in place, while the semiconductor wafer, vacuum-mounted on the wafer chuck, is moved into electrical contact with the probe pins of the probe head.

To test a die (or set of dice), an operator loads a test program that furnishes a predefined set of input values (e.g., power source, clock input, stimulus values, etc.) to the test system. An operator also loads a wafer map file to the prober that furnishes a predefined pattern that the wafer prober chuck will use to manipulate wafer movement and associated interface with the load board PCB. The load board PCB, via the spring pin tower, probe card PCB, and probe head, furnishes these input values to the die (or set of dice), and receives the output produced by the integrated circuits disposed on the die. When a die (or set of dice) have been tested, the prober moves the semiconductor wafer to the next die (or set of dice) in the wafer for testing of that die (or set of dice).

SUMMARY

Techniques are described to provide a universal direct docking tester to prober interface between the test head and the prober for testing die (integrated circuits) within semiconductor wafers. In one or more implementations, the universal direct docking tester to prober interface includes a tray assembly configured to be mounted within an opening of a prober that includes a wafer chuck configured to receive a semiconductor wafer. The universal direct docking tester to prober interface also includes a stiffener assembly configured to be mounted to a test head to support a load board PCB that includes a probe head. The probe head is operable to test one or more integrated circuits included in the wafer. The stiffener assembly includes a skirt that is received in the tray assembly when the test head is interfaced with the prober to position the load board PCB within the prober to facilitate engagement of the probe head with the wafer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
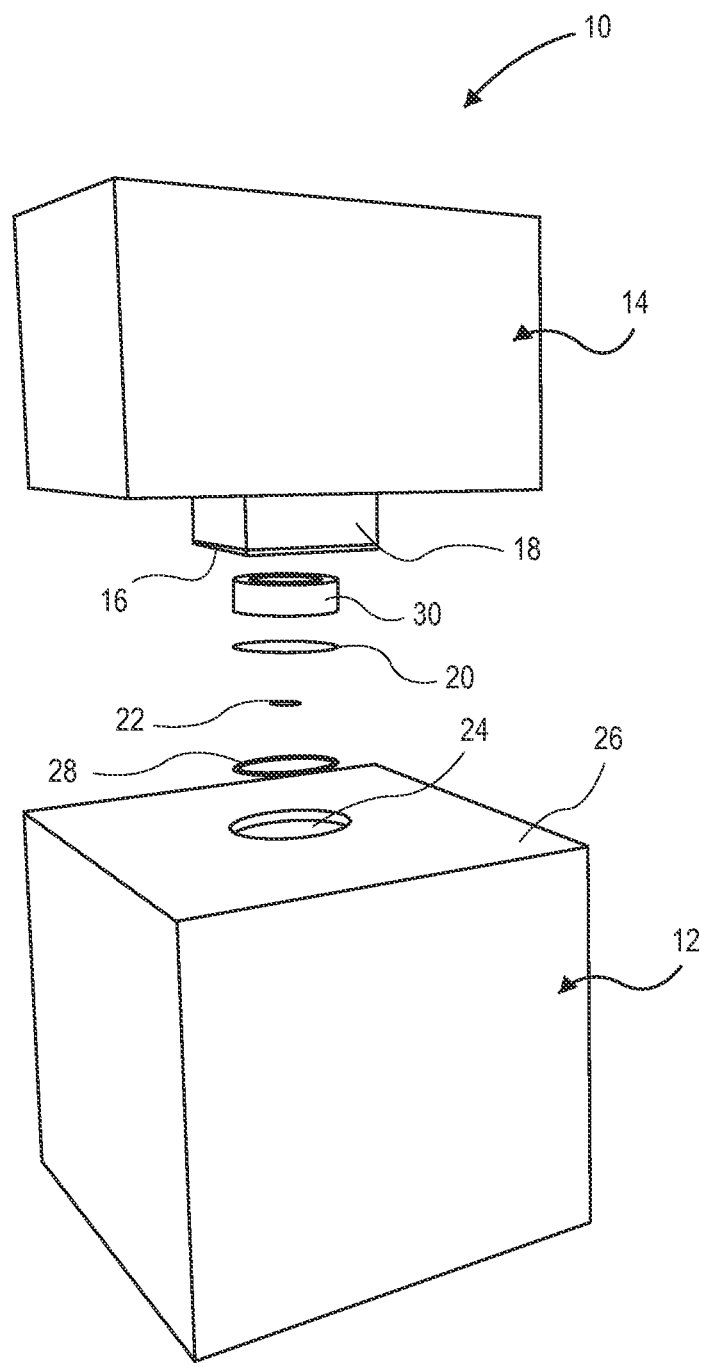
FIG. 1 is a diagrammatic isometric view illustrating a conventional semiconductor wafer prober and test head interface that includes a load board PCB, a probe card PCB, and a spring pin tower disposed between the load board printed circuit PCB and the probe card PCB.

FIG. 1 illustrates a conventional semiconductor wafer prober to test head interface 10. As shown, the wafer prober to test head interface 10 includes a prober 12 and a test head 14. A load board printed circuit board (PCB) 16 is mounted to the test head 14 via a stiffener 18. Due to size constraints associated with the load board PCB 16, a second PCB, generally referred to as the probe card PCB, 20 is employed to test the semiconductor wafer. The probe card PCB 20 includes a probe head 22 that comprises a set of probe pins (e.g., microscopic contacts) which engage pads (and/or solder bumps) disposed on the individual dice within the wafer. The probe card PCB 20 is configured to provide the electrical signals from the load board 16 to each integrated circuit (die) included in a semiconductor wafer and/or to receive outputs produced by the integrated circuits disposed on the die. The prober 12 includes a wafer chuck (not shown) that holds and positions the semiconductor wafer during testing. A circular opening 24 is formed in the top surface 26 of the prober 12. A generally circular tray 28 may be positioned proximate to the opening 24 to receive the probe card PCB 20 so that the probe head 22 is positioned for engagement with the semiconductor wafer.

A spring pin tower 30 provides connectivity between the load board PCB 16 and a probe card PCB 20. The spring pin tower 30 provides the electrical signals furnished by the load board PCB 16 to the probe card PCB 20 and transmits outputs produced by the integrated circuits. However, the spring pin tower 30 increases the distance the electrical signals travel, which can lead to signal degradation. Moreover, an increased number of connectors are required that introduce signal integrity and contact resistance issues. These connectors are also prone to damage, resulting in lost wafer prober productivity time and increased repair costs.

Accordingly, techniques are described to provide a universal direct docking tester to prober interface between the test head and the prober used for testing die (e.g., integrated circuit) within semiconductor wafers. In implementations, the universal direct docking tester to prober interface includes a tray assembly configured to be mounted within an opening of a prober. The tray assembly is configured to be mounted to the opening formed in the prober housing. Thus, the tray may be generally the same shape as the prober opening (e.g., circular, rectangular, square, etc.). The prober includes a wafer chuck configured to receive and position a semiconductor wafer for testing. The universal direct docking tester to prober interface also includes a stiffener assembly configured to be mounted to a test head for supporting a load board PCB that includes a probe head. The probe head is operable to test one or more integrated circuits included in the semiconductor wafer. The stiffener assembly includes a skirt that is received in the tray assembly when the test head is interfaced with the prober. In this manner, the stiffener assembly facilitates positioning of the load card within the prober for engagement of the probe head with the wafer (e.g., facilitates direct docking). In one or more implementations, the stiffener assembly and the skirt may be rectangular or circular in shape to be received by the rectangular or circular tray assembly, respectfully.

In the following discussion, an example universal direct docking tester to prober interface is first described. Exemplary procedures are then described that may be employed to test integrated circuits utilizing the universal direct docking tester to prober interface.

Example Implementations

FIGS. 2 through 5 illustrate a universal direct docking tester to prober interface 100 in accordance with an example implementation of the present disclosure. As shown, the tester to prober interface 100 includes a tray assembly 102 configured to be mounted within an opening 104 formed in a top surface 106 of the housing 108 of a prober 110, and a stiffener assembly 112 configured to be mounted to a test head 114 to support a load board PCB 116 that includes a probe head 118. The stiffener assembly 112 that includes a skirt 120 that is received in the tray assembly 102 when the test head 114 is interfaced with the prober 110 during testing. In this manner, the stiffener assembly 112 facilitates positioning of the load card PCB 116 within the prober 110 in a direct docking arrangement.

The prober 110 includes a wafer chuck 122 configured to receive a semiconductor wafer 124 to be tested. In implementations, the wafer chuck 122 may employ a vacuum to hold the wafer 124 in position. As shown, the wafer chuck 122 is generally circular, having a diameter greater than or equal to the diameter of the semiconductor wafer 124. A wafer positioning mechanism 126 that moves the wafer chuck 122 in three dimensions to position the semiconductor wafer 124 as the wafer 124 undergoes testing to allow the probe head(s) 118 to engage a die (or a set of dice) within the wafer 124.

The test head 114 provides an interface between the load board PCB 116 and the test system. The test head 114 includes electronic circuitry that may be configured in a variety of ways. For example, the electronic circuitry may be configured to generate input signals (e.g., the stimulus signals) for the load board PCB 116. The electronic circuitry may also be configured to compare received signals from the load board PCB 116 to validation signals furnished by the tester program to ensure the integrated circuit is functioning correctly.

The load board PCB 116 includes a probe head 118 that is operable to test one or more individual die (e.g., integrated circuits) included within the semiconductor wafer 124. As shown, the load board 116 directly interfaces with the test head 114 eliminating the need for a separate probe card PCB and spring pin tower, such as the probe card PCB 20 and spring pin tower 30 shown in FIG. 1. The probe head 118 includes one or more probe pins 128 that are configured to furnish input signals generated by the test head 114 to pads (or solder bump assemblies) of the integrated circuits of the dice within the semiconductor wafer 124. For example, one or more probe pins 128 may furnish a predefined signal (e.g., a stimulus signal) to one or more pads to test functionality of the integrated circuits associated with the pads. The predefined signals may be generated via a testing program loaded in the test system (e.g., into the test head 114). Similarly, one or more of the probes 128 receive signals generated by the integrated circuit(s) in response to the predefined signals, which are compared to validation signals furnished by the testing program. When all testing is passed by a specific die, its position is remembered for later use during IC packaging. Non-passing die are remembered. For example, non-passing die may be marked with a small dot of ink in the middle of the die, or information describing the positions of passing/non-passing die within the semiconductor wafer 124 is stored in a file (e.g., a wafer map).

Figure 2:
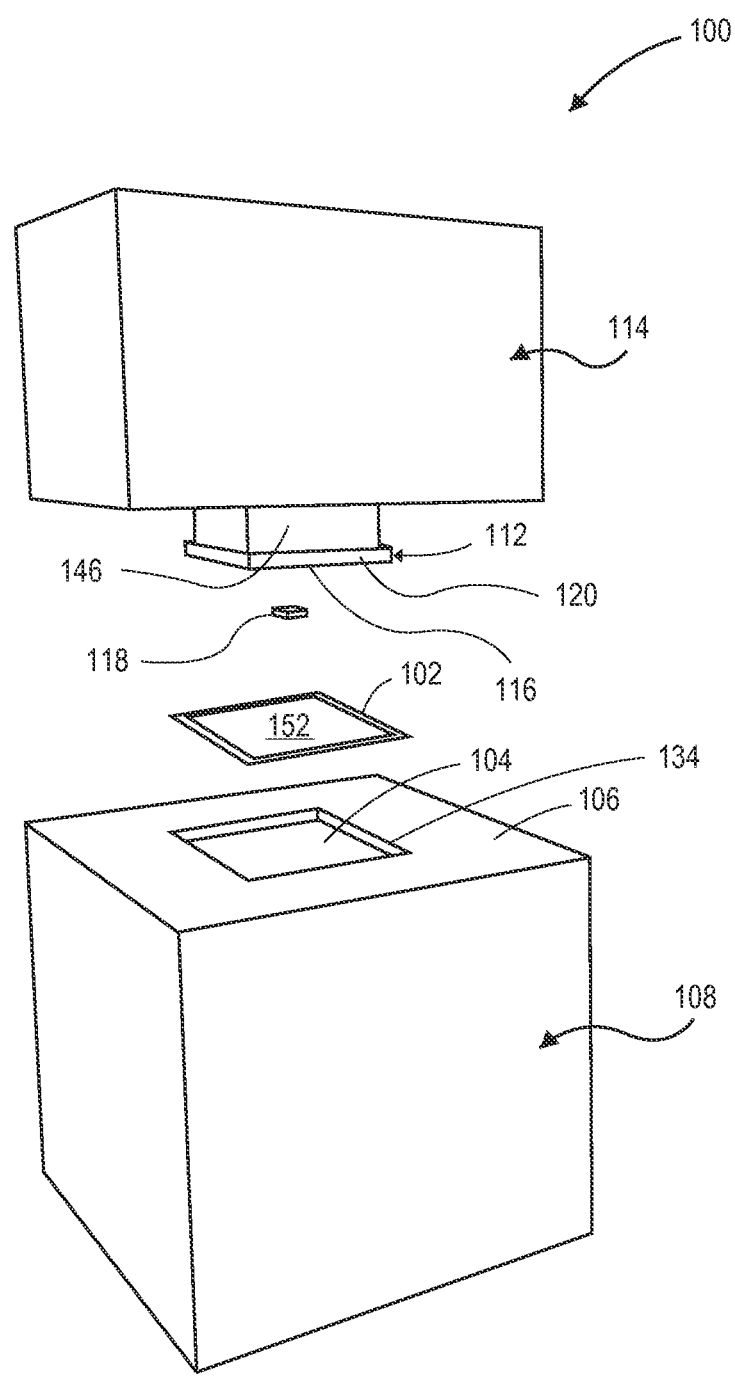
FIG. 2 is a diagrammatic isometric view illustrating a semiconductor wafer prober and test head interface that includes a universal direct docking tester to prober interface in accordance with an example implementation of the present disclosure.
Figure 3:
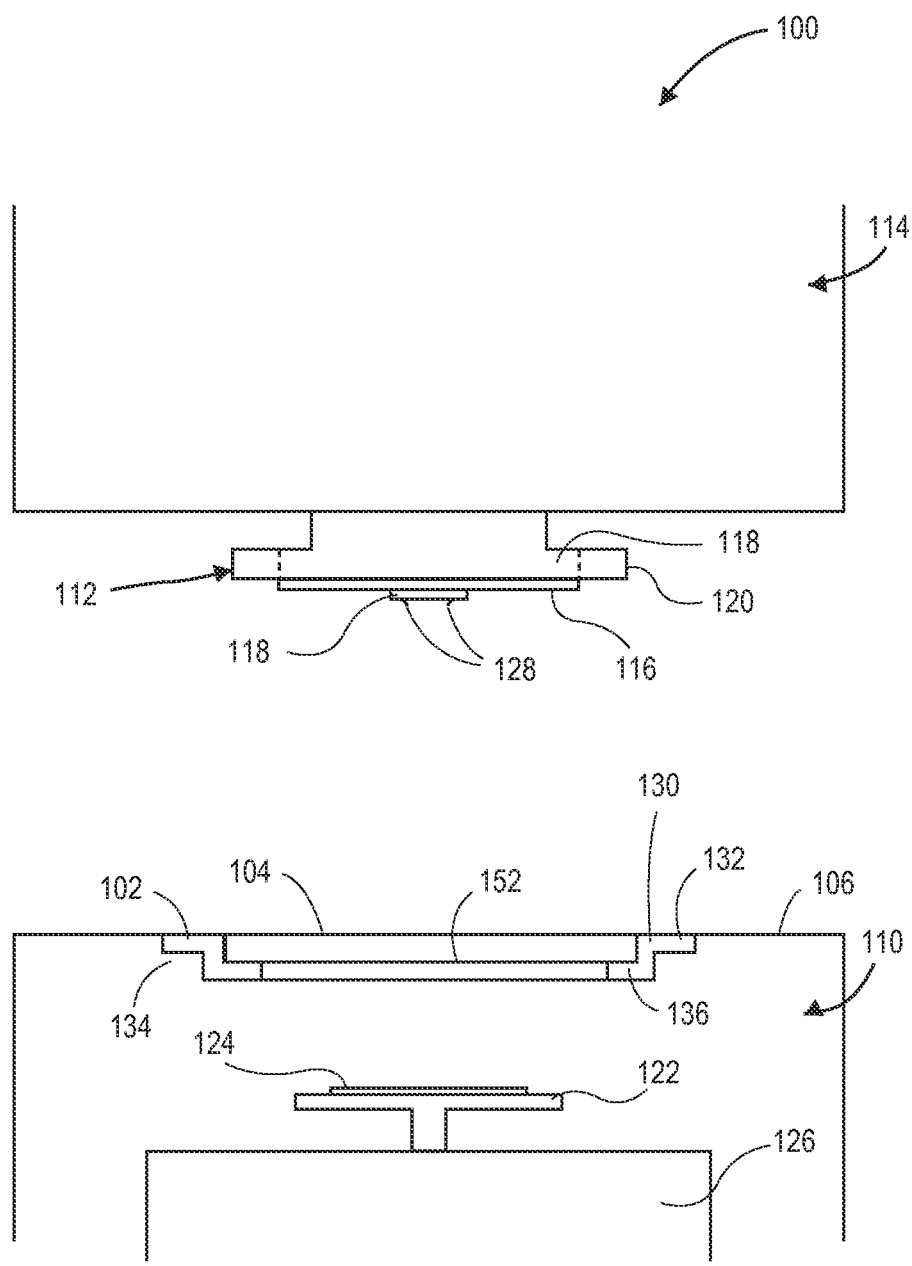
FIG. 3 is a diagrammatic partial cross-sectional view illustrating the semiconductor wafer prober and test head interface illustrated in FIG. 2.

As shown in FIG. 2, the tray assembly 102 is configured to be mounted within the opening 104 formed in a top surface 106 of the housing 108 of a prober 110. The tray assembly 102 may have a variety of configurations. For example, as shown in FIG. 3, the tray assembly 102 may comprise a frame 130 having an outer flange 132 that engages edges 134 of the opening 104 in the prober housing 108, and an inner shelf 136 that may be engaged by the stiffener assembly 112 when the test head 114 is interfaced with the prober 110.

It is contemplated that the tray assembly 102 may be generally similar in shape (e.g., may have the at least approximately the same shape and be proportional to) to the opening 104. Thus, in various implementations, the tray assembly 102 may be rectangular in shape to fit an opening 104 that is rectangular, circular in shape to fit an opening 104 that is circular, irregular in shape to fit an opening that is irregularly shaped, and so forth. In the implementation shown in FIG. 3, the frame 130 is illustrated as being generally rectangular in shape, and is configured to fit within a rectangular opening 104 in the prober housing 108. However, other configurations are possible. For example, the tray assembly 102 may comprise a generally circular frame that is configured to be mounted in a circular opening 104 formed in the prober housing 108.

As noted, the tray assembly 102 may be generally rectangular in shape. In one example implementation, the tray assembly 102 may be approximately 21.338 inches (0.54 meters) long by approximately 21.811 inches (0.55 meters) wide. However, tray assemblies 102 having other dimensions are contemplated. The tray assembly 102 defines a generally rectangular opening 152 within the opening 104 of the prober 110 when the tray assembly 102 is mounted to the prober 110. The opening 152 is defined by the shelf of the tray assembly 102. In an example implementation, the opening 152 may have dimensions of at least approximately 16.16 inches (0.41 meters) by at least approximately 16.16 inches (0.41 meters). However, tray assemblies 102 providing openings 152 having other dimensions are contemplated. Moreover, it is contemplated that the dimensions of the opening 152 are larger than the dimensions of the load board PCB 116 to facilitate direct docking configurations. The tray assembly 102 may be fabricated of a material that does not experience significant deformation (e.g., compression, bending, etc.) under loads caused by engagement of the stiffener assembly 112 with the tray assembly 102 during testing. The tray assembly may be fabricated from a variety of materials. For example, the tray assembly 102 may be fabricated from aluminum, stainless steel, a composite material, a plastic, and so on.

Figure 4:
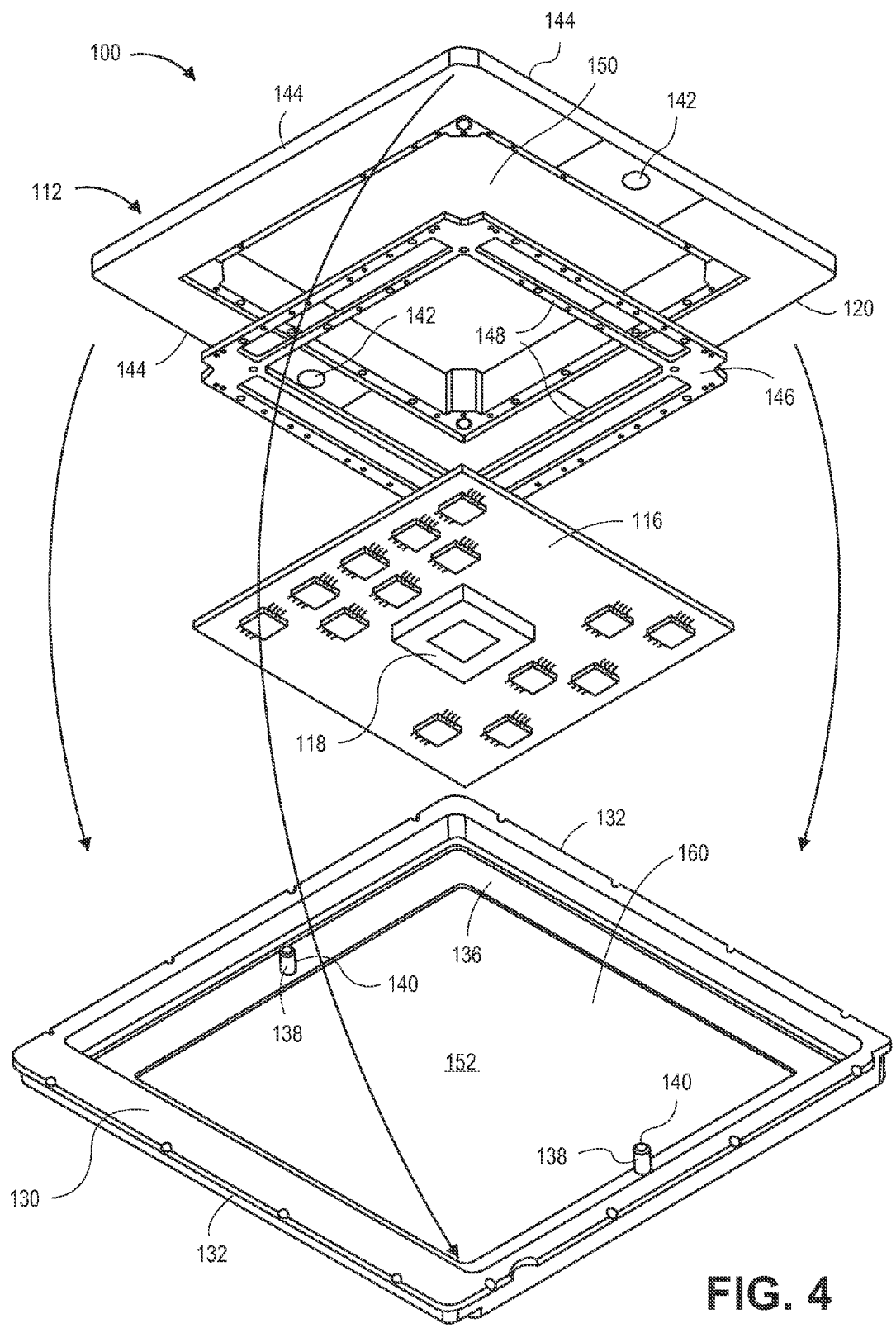
FIG. 4 is a partial exploded view illustrating an example stiffener assembly that includes a load board PCB stiffener frame and a skirt, an example load board PCB that includes a probe head, and an example tray assembly suitable for use in the universal direct docking tester to prober interface illustrated in FIG. 2.

The tray assembly 102 may be configured to hold the stiffener assembly 112 in position during testing. For example, as illustrated in FIG. 4, the tray assembly 102 may include one or more receiving members 138 that secure the stiffener assembly 112 within the frame 130. In the illustrated implementation, the receiving members 138 may comprise guide pins 140 that extend upward from the inner shelf 136 of the frame 130, which are configured to be received in one or more apertures 142 formed in flanges 144 of the stiffener assembly 112 (as described in more detail below). However, it is contemplated that the receiving members 138 are not limited to this structure, and may employ other attachment apparatus to secure the stiffener assembly 112 to the frame 130. For example, in other implementations, the receiving members 138 may comprise clamp assemblies which may clamp the flanges 144 of the stiffener assembly 112 within the frame 130 of the tray assembly 102. Other examples are possible.

Figure 5:
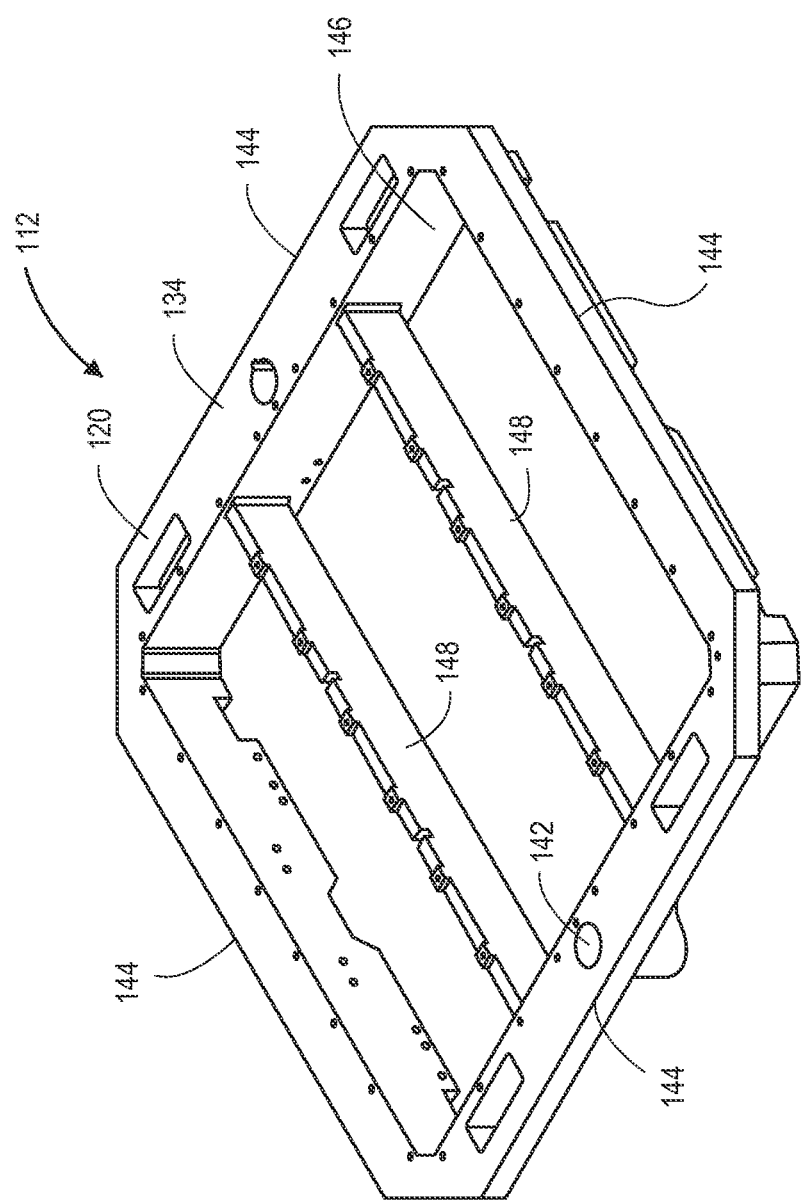
FIG. 5 is a partial isometric plan view illustrating a stiffener assembly that includes ribs in accordance with an example implementation of the present disclosure.

The stiffener assembly 112 may be configured for use with the test heads 114 of a variety of semiconductor wafer test systems. For example, the stiffener assembly illustrated in FIG. 4 is configured to be received by a LTX-MX test system manufactured by (OEM) by LTX-Credence. Similarly, the stiffener assembly 112 illustrated in FIG. 5 is configured to be received by a Teradyne uFlex test system manufactured by Teradyne Inc. Stiffener assemblies 112 configured for use with the test heads of other semiconductor test systems are contemplated.

As illustrated in FIG. 4, the stiffener assembly 112 may include a stiffener frame 146 configured to receive and support the load board PCB 116. The load board PCB 116 may be attached to the stiffener frame 146 via one or more fasteners (e.g., screws, bolts, etc.) so that the load board PCB 116 remains secured during testing. The stiffener frame 146 may be configured in variety of ways. In implementations, the stiffener frame 146 may be generally similar in shape (e.g., may have the at least approximately the same shape and be proportional to) to the tray assembly 102 and the opening 104.

Thus, the stiffener frame 146 may have a circular shape in implementations where the tray assembly 102 and the opening 104 are circular in shape. Similarly, the stiffener frame 146 may have a rectangular shape when the tray assembly 102 and the opening 104 are rectangular in shape. In one example, the stiffener frame 146 may have a generally rectangular shape, and may be sized for attachment of the load board PCB 116. In an example wherein the stiffener frame 146 is rectangular, the stiffener frame 146 may be approximately 14 inches (0.3556 meters) long by approximately 14 inches (0.3556 meters) wide to accommodate a 14×14 inch load board PCB 116. However, stiffener frames having other dimensions are contemplated. In another example, the stiffener frame 146 may have a generally circular shape (not shown). The stiffener frame 146 is fabricated of a suitable material, such as a metal (e.g., aluminum, stainless steel, etc.), a composite, a plastic, and so on.

In one or more implementations, the stiffener frame 146 may include one or more ribs 148 configured to support the load board PCB 116. The ribs 148 may be configured in a variety of ways, and may be fabricated of a material (e.g., a metal such as aluminum or stainless steel, a composite material, a plastic material, etc.) having sufficient mechanical stiffness to adequately support the center areas of the load board PCB 116. It is contemplated that the number and the position of the ribs 148 may vary depending on the type of load board PCB 116 used. For example, in the example implementation shown in FIG. 5, the stiffener frame 146 is illustrated as including two ribs 148 that trisect the stiffener frame 146. However, it is contemplated that the stiffener frame 146, may include only one rib 148 that bisects the stiffener frame 146 or three or more ribs 148 that may be spaced regularly or irregularly with the stiffener frame 146. In another example implementation, illustrated in FIG. 4, the stiffener frame 146 may include one or more ribs 148 positioned near the periphery of the frame 146, but no ribs bisecting the frame 146. It is further contemplated that the dimension of ribs 148 may vary depending on the load board PCB 116 used. For instance, in the example implementation shown in FIG. 5, each rib 148 is at least approximately 0.375 inches (0.009525 meters) wide and at least approximately 15.25 inches (0.38735 meters) long. However, ribs 148 having other dimensions are possible.

As noted above, the stiffener assembly 112 further includes a skirt 120 extending around the periphery of the stiffener frame 146. As shown in FIG. 4, the skirt 120 may include an opening 150 in which the stiffener assembly 146 is received. In this implementation, the skirt may be attached to the stiffener frame 146 via one or more fasteners (e.g., screws, bolts, etc.). However, in other implementations, such as shown in FIG. 5, the stiffener frame 146 and skirt 120 may be a single integrated component. The skirt 120 is configured to be received by the tray assembly 102 when the test head 114 is engaged with the prober 110. For example, as noted, the skirt 120 may include one or more flanges 144 (four flanges 144 are shown) that are received against the inner lip 136 of the tray assembly frame 130 and secured to the frame 130 by receiving members 138. When the test head 114 is engaged with the prober 110 (e.g., flanges 144 are engaged within frame 130), the skirt 120 functions to position the load board PCB 116 within the prober 110 through the frame 130 (e.g., through rectangular opening 152) so that the probe head 118 mounted to the load card 116 may be engaged with the semiconductor wafer 124 being tested.

The skirt 120 may be configured in variety of ways. In implementations, the skirt 120 may have a shape that is generally similar to (e.g., may have the at least approximately the same shape and be proportional to) the shape of the tray assembly 102, the opening 104, and the stiffener assembly 112 (e.g., rectangular, circular, etc.). For example, stiffener assemblies 112 having rectangular shaped skirt assemblies 120 with one or more clipped corners are illustrated in FIGS. 4 and 5. However, skirt assemblies 112 that are generally circular in shape are contemplated in implementations that employ circular tray assemblies 102, openings 104, and/or stiffener assemblies 112. Skirt assemblies 120 having other shapes (e.g., irregular) are possible.

The skirt 120 is sized to be received within the frame 130 of the tray assembly 102 to rest on the inner lip 136 of the frame 130. It is contemplated that the dimensions of the skirt 120 may vary depending on the size of the load board PCB 116 and the dimensions of the tray assembly 102. In an example implementation, the skirt 120 may have a length of at least approximately 19 inches (0.4826 meters) and a width of at least approximately 18.32 inches (0.465328 meters). In this implementation, the opening 150 defined by the skirt 120 may be at least approximately 13 inches (0.33 meters) by at least approximately 13 inches (0.33 meters). The skirt 120 is fabricated of a suitable material, such as a metal (e.g., aluminum, stainless steel, etc.), a composite, a plastic, and so on. In implementations, the skirt 120 may be manufactured used to fabricate the stiffener frame 146. However, it is contemplated that different materials may be used.

During testing, the load board PCB 116 is mounted to the stiffener assembly 112. For example, as described above, the load board PCB 116 may be attached to the stiffener frame 146, which is in turn mounted within the skirt 120. The stiffener assembly 112 is then mounted to the test head 114 associated with the prober 110 to support a load board PCB 116. A semiconductor wafer 124 to be tested is positioned on the wafer chuck 122 of the prober 110, and the wafer chuck 122 is actuated so that the wafer 124 is held against the chuck 108 (e.g., via a vacuum).

The test head 114 is lowered onto the prober 110 until test head 114 engages the prober 110. When the test head 114 and the prober 110 are engaged, the stiffener assembly 112 is received by the tray assembly 102 (e.g., the flanges 144 of the skirt 120 rest against the inner shelf 136 of the tray assembly frame 130). The load board PCB 116 is thus positioned within the prober 110 so that the probe head 118 of the load board PCB 116 may engage the semiconductor wafer 124. The operator may then initiate testing of the integrated circuits of the die formed in the wafer 124 via a test program loaded into the test system.

In implementations, multiple stiffener assemblies 112, each configured to mount a different load board PCB 116 (e.g., load board PCBs 116 configured to test semiconductor wafers 124 having different integrated circuit designs), may be provided. The skirts 120 of these stiffener assemblies 112 may have consistent outside dimensions to fit within a tray 102 of generally similar inside dimensions. Thus, a stiffener assembly 112 supporting a first load board PCB 116 may be removed (demounted) from the test head 114 and a second stiffener assembly 112 supporting a second load board PCB 116 mounted to the test head in its place. In this manner, the load board PCBs 116 may be more easily interchanged to facilitate test set-up.

The present techniques facilitate direct docking of the load board PCB 116 with the prober 110. The techniques thus eliminate the need for a spring pin tower (e.g., spring pin tower 30 shown in FIG. 1) and at least one probe card PCB (e.g., probe card PCB 20 shown in FIG. 1). The elimination of the spring pin tower allows the probe head 130 to interface directly with the load board PCB 116, which directly interfaces with the test head 114. This arrangement reduces the distance the input signals and the output signals travel, which may increase signal integrity.

Example Processes

Figure 6:
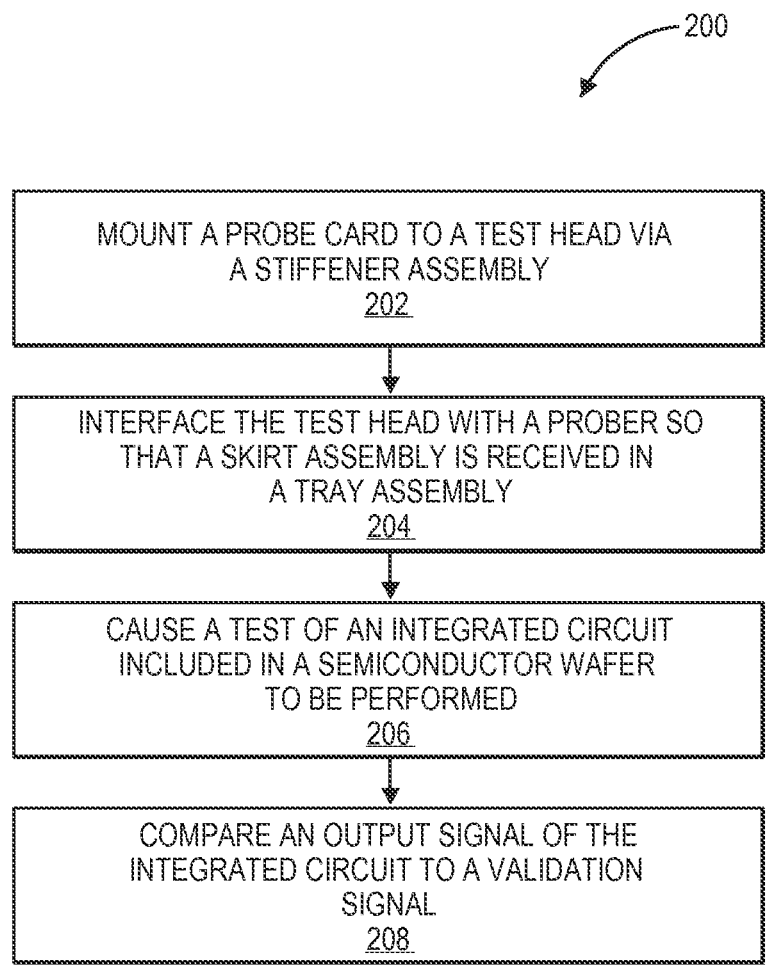
FIG. 6 is a flow diagram illustrating an example process for testing a semiconductor wafer utilizing a semiconductor wafer prober equipped with the universal direct docking tester to prober interface illustrated in FIGS. 2 through 5.

FIG. 6 illustrates an example process 200 that employs direct docking techniques to test integrated circuits fabricated in semiconductor wafers. The process 200 employs a universal direct docking tester to prober interface, such as the interface 100 shown in FIGS. 2 through 5. It is contemplated that the process 200 may be utilized with digital logic integrated circuit devices, analog integrated circuit devices, or mixed-signal integrated circuit devices.

In the process 200 illustrated, a load board PCB that includes a probe head is mounted to a test head of a semiconductor wafer prober via a stiffener assembly (Block 202). The probe head includes one or more probe pins configured to test one or more integrated circuits fabricated in a semiconductor wafer. As describe above, the pins may furnish one or more stimulus signals (e.g., clock, power, input, etc.) to pads deployed over the wafer and associated with the integrated circuit(s) and/or may receive output signals from the integrated circuit.

The stiffener assembly includes a skirt configured to be received in a tray assembly that is mounted with an opening of a prober. The prober is configured to receive the semiconductor wafer. For example, in implementations, the prober includes a wafer chuck that is configured to receive and hold the wafer in position during testing. In an example implementation, the tray assembly may be comprised of a generally rectangular frame having dimensions of at least approximately 21.338 inches (0.54 meters) by approximately 21.811 inches (0.55 meters). In this implementation, the skirt may also be generally rectangular in shape, and may have dimensions of at least approximately 19 inches (0.4826 meters) by at least approximately 18.32 inches (0.465328 meters). The stiffener frame, which may be generally rectangular in shape, can have dimensions of at least approximately 14 inches (0.3556 meters) by at least approximately 14 inches (0.3556 meters). It is contemplated that the tray assembly and the stiffener frame may also be generally circular in shape.

The test head is interfaced with the prober so that the skirt is received in the tray assembly (Block 204). The skirt is configured to position the load board within the prober to facilitate engagement of the probe head with the wafer when the tray assembly receives the skirt (e.g., the probe pins of the probe head are positioned to engage with pads of integrated circuits and/or solder bump assemblies) formed on the wafer.

A testing program may then cause a test to be performed on an integrated circuit included in the wafer (Block 206). As described above, the load board PCB may furnish input signals (e.g., stimulus signals) to one or more pads associated with each integrated circuit being tested. The input signals are predefined and generated by the tester program. The input signal(s) may comprise a voltage signal or a current signal (e.g., a clock signal, a first stimulus signal, a second stimulus signal, a power source, etc.).

An output signal of the integrated circuit, which is generated in response to the furnished input signals, may then be compared against a validation signal (Block 208) that is furnished by the test program. For example, one or more of the probe pins of the probe head may receive an output signal from the integrated circuit being tested via one or more pads of the circuit. In an implementation, the probe pins receiving the output signal may be distinct from the probe pins furnishing the input signals. Thus, for example, a first pin may generate an input signal and a second pin may receive an output signal. In another implementation, the pins receiving the output signals may be the same pins furnishing the input signals. For example, a first pin may generate an input signal on a first clock cycle and receive an output signal on a second clock cycle. The output signal may be compared against the validation signal based upon predefined criteria (e.g., signal strength, signal timing, etc.).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
   mounting a load board PCB having a probe head operable to test one or more integrated circuits included in a semiconductor wafer to a test head via a stiffener assembly, the stiffener assembly including a skirt configured to be received in a tray assembly mounted within an opening of a prober configured to receive the semiconductor wafer, where the skirt extends around the periphery of the stiffener assembly, the skirt including at least one flange that is configured to be received against an inner lip of a tray assembly frame and to be secured to the tray assembly frame by at least one receiving member;
   interfacing the test head with a prober so that the skirt is received in the tray assembly to position the load board PCB within the prober to facilitate engagement of the probe head with the semiconductor wafer; and
   causing a test of an integrated circuit included in the semiconductor wafer to be performed.

2. The process as recited in claim 1, wherein the stiffener assembly includes a stiffener frame configured to mount the load board PCB.

3. The process as recited in claim 1, wherein the opening is sized to receive the load board PCB and is formed in a top of the prober; and wherein the tray assembly comprises a frame configured to fit onto edges of the opening.

4. The process as recited in claim 1, wherein the skirt comprises one or more flanges configured to be received within the frame.

5. The process as recited in claim 1, further comprising comparing an output signal against a validation signal furnished by a tester program.

6. The process as recited in claim 1, wherein the tray assembly defines an opening configured to receive the load board PCB there through to facilitate direct docking.

7. The process as recited in claim 1, wherein the frame comprises one or more receiving members configured to secure the stiffener assembly within the frame.

8. The process as recited in claim 7, wherein the skirt comprises a skirt attached to the stiffener frame.

9. The process as recited in claim 1, wherein the opening is sized to receive the load board PCB and is formed in a top of the prober; and wherein the tray assembly comprises a frame configured to fit onto edges of the opening.

10. The process as recited in claim 9, wherein the skirt comprises one or more flanges configured to be received within the frame.

* * * * *